United States Patent
Lin

(10) Patent No.: US 12,406,860 B2
(45) Date of Patent: Sep. 2, 2025

(54) METHOD OF FORMING CONDUCTIVE LAYER OF SEMICONDUCTOR DEVICE

(71) Applicant: NANYA TECHNOLOGY CORPORATION, New Taipei (TW)

(72) Inventor: Yu Shu Lin, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 512 days.

(21) Appl. No.: 17/815,215

(22) Filed: Jul. 27, 2022

(65) Prior Publication Data

US 2024/0038545 A1    Feb. 1, 2024

(51) Int. Cl.
H01L 21/3213    (2006.01)

(52) U.S. Cl.
CPC .. *H01L 21/32136* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 8,609,546 B2 * | 12/2013 | Lee | H01L 21/32136 438/711 |
| 2007/0202700 A1 * | 8/2007 | Leucke | C23F 4/00 257/E21.252 |
| 2018/0337047 A1 * | 11/2018 | Fung | H01L 21/0337 |

* cited by examiner

*Primary Examiner* — Stephanie P Duclair
(74) *Attorney, Agent, or Firm* — CKC & Partners Co., LLC

(57) ABSTRACT

A method of forming a conductive layer of a semiconductor device is described. The method includes forming a hard mask layer on a metal layer overlying a substrate, in which the metal layer includes tungsten. The method further includes patterning the hard mask layer until portions of the metal layer are exposed from the patterned hard mask layer. The method further includes performing a plasma process to the metal layer through the patterned hard mask layer until portions of the substrate are exposed from the etched metal layer, in which a process gas mixture used in the plasma process includes a fluorine based gas, a chlorine based gas, and oxygen.

15 Claims, 11 Drawing Sheets

METHOD OF FORMING CONDUCTIVE LAYER OF SEMICONDUCTOR DEVICE

BACKGROUND

Technical Field

The present disclosure relates to a method of manufacturing a semiconductor device. More particularly, the present disclosure relates to a method of forming a conductive layer of a semiconductor device.

Description of Related Art

In semiconductor device fabrication, conductive layers are formed for electrically conductive interconnect features on substrates. As the integration density of semiconductor devices increases, distances between conductive interconnect features gradually decrease in a highly miniaturized semiconductor device. The need arises to obtain features having surfaces of small areas and spaced by small gaps. In a typical process for forming desired features on a conductive layer, wet-chemical etching (e.g., using fluorine based etchant or chlorine based etchant) is applied to etch a refractory metal (e.g., tungsten) layer. However, wet-chemical etching used for transferring patterns has a major disadvantage of undercutting the layer under the etch mask. As a result, a loss in the etched pattern resolution occurs.

Besides, the etch rate depends on the exposed area in wet-chemical etching process. For example, in the fabrication of a semiconductor memory device including a cell region of closely arranged bit lines and a peripheral region of dispersed connection pads, the etch rate at the peripheral region is higher than that at the cell region in wet-chemical etching. Local variations in the pattern density will cause local variations in the etch rate. Therefore, to ensure profile control, if a conductive layer has several zones having different pattern densities, the wet-chemical etching process is generally performed in multiple stages for etching different zones, which significantly increases the processing time.

Accordingly, how to provide a method of forming a conductive layer of a semiconductor device to solve the aforementioned problems becomes an important issue to be solved by those in the industry.

SUMMARY

An aspect of the disclosure is to provide a method of forming a conductive layer of a semiconductor device that may efficiently solve the aforementioned problems.

According to an embodiment of the disclosure, a method of forming a conductive layer of a semiconductor device includes forming a hard mask layer on a metal layer overlying a substrate, in which the metal layer includes tungsten. The method further includes patterning the hard mask layer until portions of the metal layer are exposed from the patterned hard mask layer. The method further includes performing a plasma process to the metal layer through the patterned hard mask layer until portions of the substrate are exposed from the etched metal layer, in which a process gas mixture used in the plasma process includes a fluorine based gas, a chlorine based gas, and oxygen.

In an embodiment of the disclosure, the patterning the hard mask layer forms a first patterned zone and a second patterned zone in the patterned hard mask layer. The first patterned zone includes a plurality of first patterns. The second patterned zone includes a plurality of second patterns. A first gap between adjacent two of the first patterns is smaller than about 25 nm A second gap between adjacent two of the second patterns is greater than the first gap.

In an embodiment of the disclosure, the hard mask layer includes carbon.

In an embodiment of the disclosure, at least a portion of the patterned hard mask layer remains on the etched metal layer when the portions of the substrate are exposed from the etched metal layer.

In an embodiment of the disclosure, the performing the plasma process includes: placing the substrate with the patterned hard mask layer thereon into a plasma process chamber; supplying the process gas mixture into the plasma process chamber; and generating a plasma from the process gas mixture to etch the metal layer through the patterned hard mask layer.

In an embodiment of the disclosure, the fluorine based gas includes nitrogen trifluoride and the chlorine based gas includes chlorine.

In an embodiment of the disclosure, a volumetric flow ratio between chlorine and nitrogen trifluoride of the process gas mixture supplied into the plasma process chamber is in a range from about 1.0 to about 2.0.

In an embodiment of the disclosure, a volumetric flow ratio between oxygen and nitrogen trifluoride of the process gas mixture supplied into the plasma process chamber is in a range from about 1.0 to about 2.0.

In an embodiment of the disclosure, the plasma process is performed at a bias voltage supplied in a pulse waveform.

In an embodiment of the disclosure, the performing the plasma process includes a first stage and a second stage. The first stage is conducted at a first bias voltage supplied in a first pulse waveform having a first amplitude. The second stage is conducted at a second bias voltage supplied in a second pulse waveform having a second amplitude. The second amplitude is greater than the first amplitude.

According to another embodiment of the disclosure, a method of forming a conductive layer of a semiconductor device includes forming a hard mask layer on a metal layer overlying a substrate, in which the metal layer includes tungsten. The method further includes patterning the hard mask layer until portions of the metal layer are exposed from the patterned hard mask layer, such that the patterned hard mask layer has a first patterned zone and a second patterned zone, in which the first patterned zone includes a plurality of first patterns, the second patterned zone includes a plurality of second patterns, a first gap between adjacent two of the first patterns is smaller than about 25 nm, and a second gap between adjacent two of the second patterns is greater than the first gap. The method further includes performing a plasma process to the metal layer through the patterned hard mask layer until portions of the substrate are exposed from the etched metal layer.

In an embodiment of the disclosure, the hard mask layer includes carbon.

In an embodiment of the disclosure, at least a portion of the patterned hard mask layer remains on the etched metal layer when the portions of the substrate are exposed from the etched metal layer.

In an embodiment of the disclosure, the performing the plasma process includes: placing the substrate with the patterned hard mask layer thereon into a plasma process chamber; supplying the process gas mixture into the plasma process chamber; and generating a plasma from the process gas mixture to etch the metal layer through the patterned hard mask layer.

In an embodiment of the disclosure, the process gas mixture includes a fluorine based gas, a chlorine based gas, and oxygen. The fluorine based gas includes nitrogen trifluoride. The chlorine based gas includes chlorine. The metal layer is etched such that the metal layer forms a first etched zone and a second etched zone upon completion of the plasma process. The first etched zone includes a plurality of first trenches. The second etched zone includes a plurality of second trenches. A first width of one of the first trenches is smaller than about 25 nm. A second width of one of the second trenches is greater than the first width.

In an embodiment of the disclosure, a volumetric flow ratio between chlorine and nitrogen trifluoride of the process gas mixture supplied into the plasma process chamber is in a range from about 1.0 to about 2.0.

In an embodiment of the disclosure, a volumetric flow ratio between oxygen and nitrogen trifluoride of the process gas mixture supplied into the plasma process chamber is in a range from about 1.0 to about 2.0.

In an embodiment of the disclosure, the plasma process is performed at a bias voltage supplied in a pulse waveform.

In an embodiment of the disclosure, the performing the plasma process includes a first stage and a second stage. The first stage is conducted at a first bias voltage supplied in a first pulse waveform having a first amplitude. The second stage is conducted at a second bias voltage supplied in a second pulse waveform having a second amplitude. The second amplitude is greater than the first amplitude.

Accordingly, in the method of the present disclosure, by applying a plasma process with a certain composition of the process gas mixture or further with pulsing bias voltage, substantially anisotropic etching may be achieved. In addition, with optimally selected volumetric flow ratios of the process gas mixture supplied into the plasma process chamber and an optimally selected thickness of the hard mask layer, the etch profile control may be improved and a more uniform etch rate across the device may be accomplished. This allows for a desired conductive layer having several zones with different pattern densities to be fabricated in one process.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
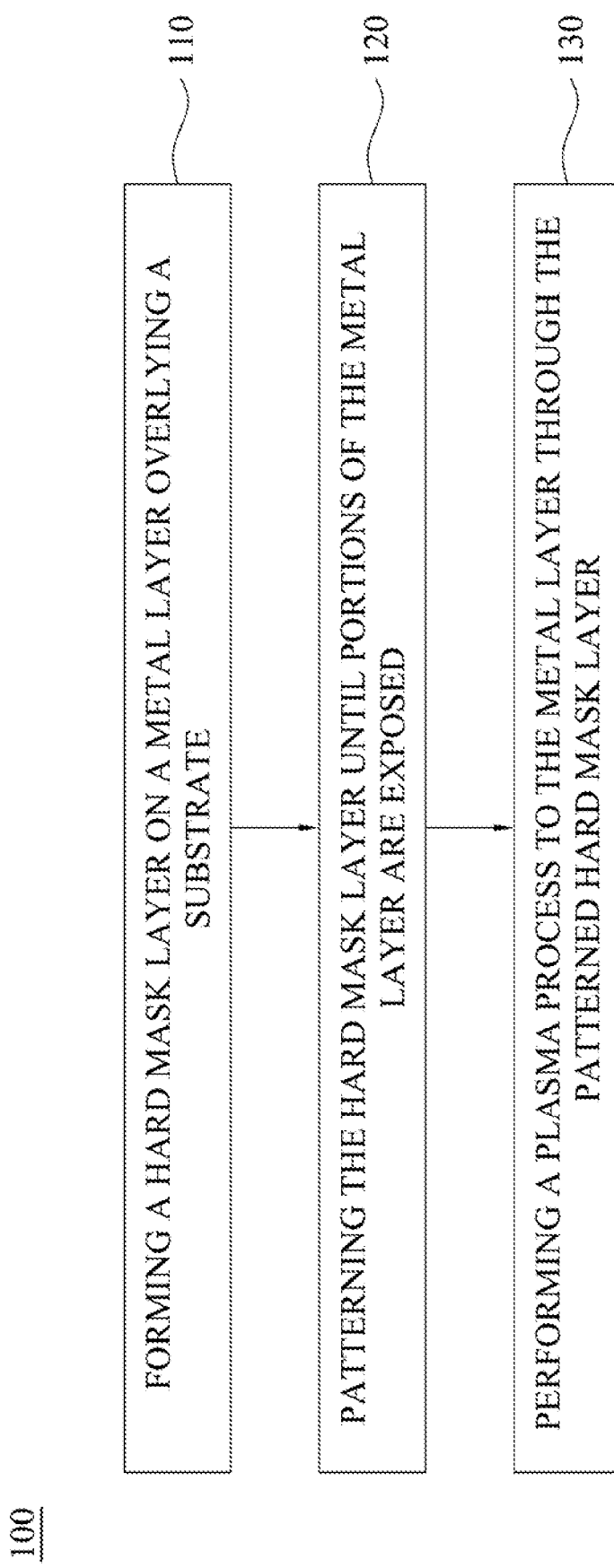
FIG. 1 is a flow chart of a method of forming a conductive layer of a semiconductor device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 illustrates a flow chart of method 100 according to an embodiment of the present disclosure. As shown in FIG. 1, in the present embodiment, method 100 involves operation 110 of forming a hard mask layer on a metal layer overlying a substrate. Method 100 also involves operation 120 of patterning the formed hard mask layer using any suitable patterning method, until portions of the metal layer are exposed from the patterned hard mask layer. Method 100 proceeds to operation 130 of performing a plasma process to the metal layer through the patterned hard mask layer until portions of the substrate are exposed from the etched metal layer.

Figure 2:
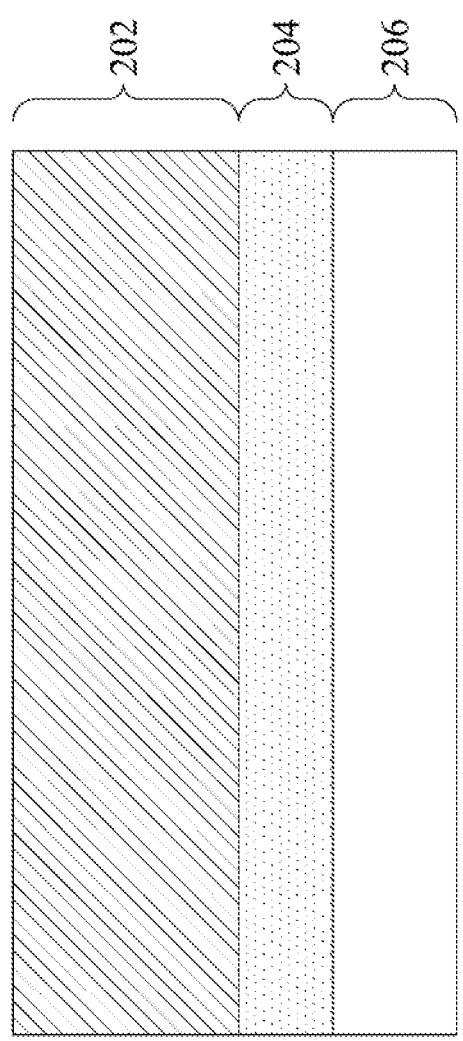
FIG. 2 is a partial cross-sectional view of an intermediate structure formed by the method according to an embodiment of the disclosure.

Reference is made to FIG. 2. FIG. 2 is a partial cross-sectional view of an intermediate structure formed by operation 110 in method 100 according to an embodiment of the present disclosure. As shown in FIG. 2, a hard mask layer 202 is formed on a substrate 206 with a metal layer 204 thereon. According to an exemplary embodiment, the hard mask layer 202 is made of carbon, the metal layer 204 is made of tungsten, and the substrate 206 may be made of any dielectric material, such as silicon oxide (SiO), and silicon nitride (SiN), a combination thereof, or the like.

Figure 3:
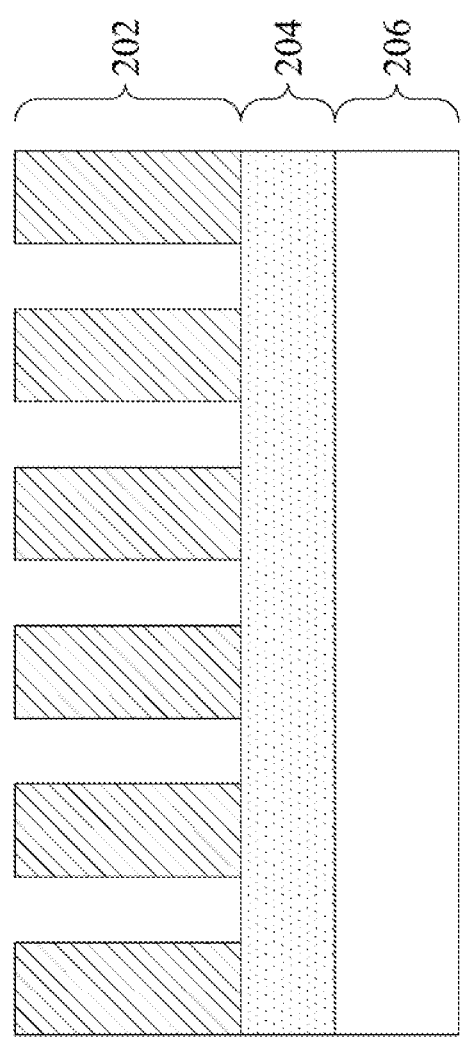
FIG. 3 is a partial cross-sectional view of an intermediate structure formed by the method according to an embodiment of the disclosure.

Reference is made to FIG. 3. FIG. 3 shows a partial cross-sectional view of an intermediate structure formed by operation 120 in method 100 according to an embodiment of the present disclosure. As shown in FIG. 3, the hard mask layer 202 is patterned until portions of the metal layer 204 are exposed. The hard mask layer 202 is then used as an etching mask for etching the metal layer 204. Thus, the patterns of the hard mask layer 202 are features dimensioned in accordance with features desired to be etched into the metal layer 204. The hard mask layer 202 may be patterned using a photolithographic masking and etching process, electron beam lithography (EBL), or the like. However, any suitable method of manufacturing and/or patterning the hard mask layer 202 can be utilized.

Figure 4:
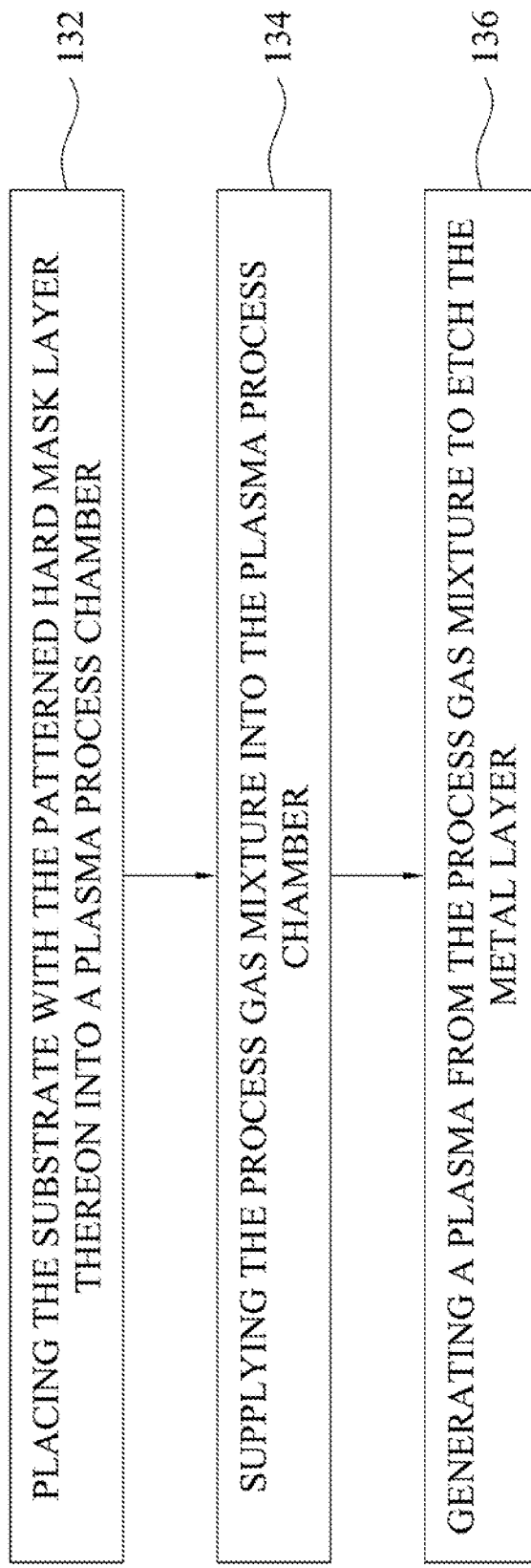
FIG. 4 is a flow chart of an operation of the method according to an embodiment of the present disclosure.

Reference is made to FIG. 4 FIG. 4 is a flow chart of operation 130 in method 100 according to an embodiment of the present disclosure is illustrated. As shown in FIG. 4, operation 130 starts with step 132 of placing the substrate with the patterned hard mask layer thereon into a plasma process chamber. Operation 130 proceeds to step 134 of supplying the process gas mixture into the plasma process chamber. Operation 130 further involves step 136 of generating a plasma from the process gas mixture to etch the metal layer through the patterned hard mask layer.

During plasma etching, the introduced process gas mixture produces highly energetic and reactive species in the plasma. The highly energetic and reactive species bombard the surfaces of the intermediate structure, causing momentum transfer. Also, the reactive species have chemical reactions with the surfaces of the intermediate structure. In turn, the portions adjacent to the surfaces are broken down into volatile etch products and/or smaller molecules. The volatile etch products and the molecules are then removed by the plasma process chamber.

Figure 5:
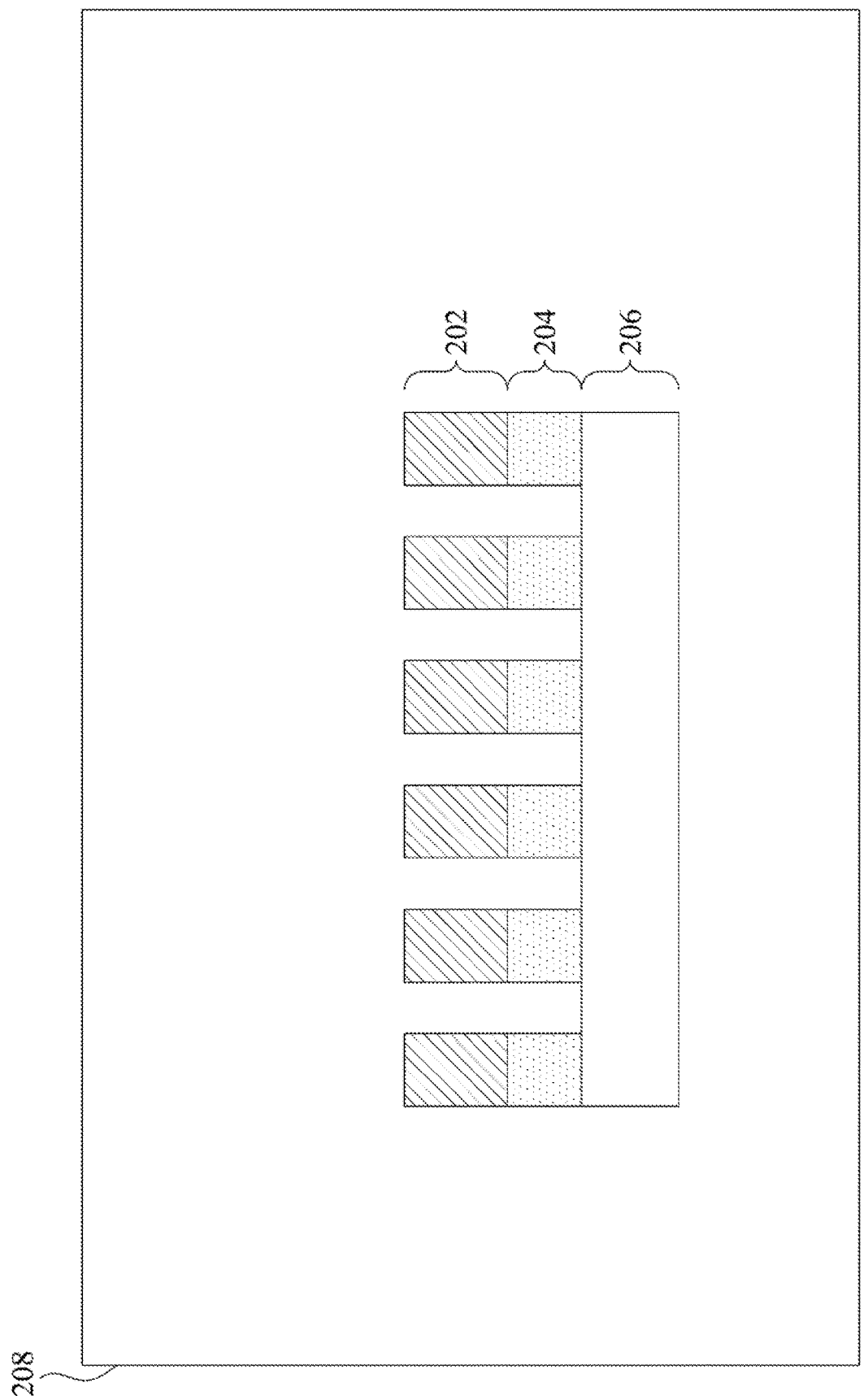
FIG. 5 is a partial cross-sectional view of an intermediate structure formed by the method according to an embodiment of the disclosure.

Reference is made to FIG. 5. FIG. 5 is a partial cross-sectional view of an intermediate structure formed by operation 130 in method 100 according to an embodiment of the present disclosure. After the plasma process in the plasma process chamber 208, the patterns of the hard mask layer 202 are transferred to the etched metal layer 204 until reaching an etch depth such that portions of the substrate are exposed from the etched metal layer 204.

The plasma process is sensitive to pressure changes in the plasma process chamber. When the pressure in the plasma process chamber is lower, the mean free paths of the highly energetic and reactive species are longer. Thus, the average distance the species travel before encountering a collision with one another allows the species to develop the speed required for bombardment. On the contrary, when the pressure in the plasma process chamber is too high, the mean free paths of the species are too short. Thereby, the species cannot develop sufficient kinetic energies for bombardment. Also, frequent collisions between the species make the material removal more non-directional, and thus the etching is undesirably more isotropic.

According to an exemplary embodiment, in order to ensure longer mean free paths of the species, the pressure in the plasma process chamber 208 is regulated from about 3 mTorr to about 9 mTorr, more typically from about 3 mTorr to about 5 mTorr, and preferably at about 3 mTorr.

In some embodiments, a bias voltage is supplied to the plasma process chamber to accelerate the ions towards the top surface of the intermediate structure. This ensures that the bombarding ion has a large velocity component along the normal vector of the top surface of the intermediate structure. Therefore, an etch profile that has minimal undercut and is highly anisotropic can be achieved. Also, by increasing the bias voltage, the kinetic energy of the bombarding ion is increased and thereby resulting in a higher etch rate. In an exemplary embodiment, a transformer coupled plasma (TCP) system with an RF source frequency of 13.56 MHz is utilized. A source power in the range from about 300 W to about 500 W is applied. In such embodiment, the bias voltage may be supplied at direct current (DC) in a range from about 150 V to about 400 V, more preferably from about 150 V to about 300 V.

To make plasma etching more anisotropic, the present disclosure further requires the use of a process gas mixture of a fluorine based gas, a chlorine based gas, and oxygen ($O_2$). The fluorine based gas may be nitrogen trifluoride ($NF_3$), tetrafluoromethane ($CF_4$), sulfur hexafluoride ($SF_6$), etc. The etching using $NF_3$ shows less lateral etching than using $CF_4$ or $SF_6$, and thus the etch profile etched using $NF_3$ is more satisfactory in the case of densely arranged patterns. The chlorine based gas may be, for example, chlorine ($Cl_2$). According to an exemplary embodiment, the process gas mixture supplied into the plasma process chamber 208 includes $NF_3$, $Cl_2$, and $O_2$.

The volumetric flow ratios of different gases in the process gas mixture are also optimally selected to make etching more anisotropic and make etch rates across the device surface more uniform. According to an exemplary embodiment, the volumetric flow ratio between $Cl_2$ and $NF_3$ is in a range from about 1.0 to about 2.0, such as about 1.6, while the volumetric flow ratio between $O_2$ and $NF_3$ is in a range from about 1.0 to about 2.0, such as about 1.2. The composition of the process gas mixture according to the present embodiment provides desirable control of the critical dimensions of the etched features.

Figure 6:
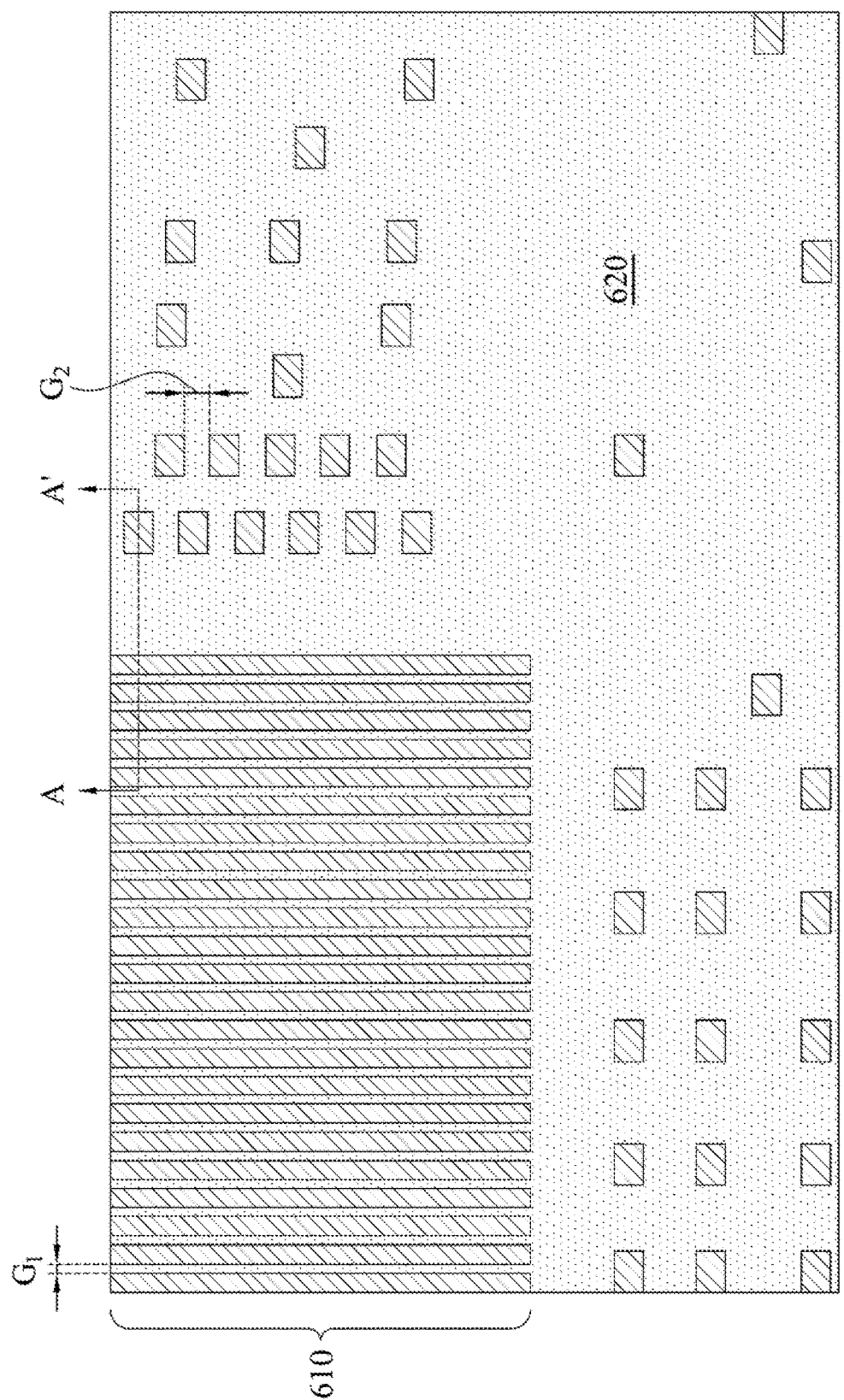
FIG. 6 is a partial top view of an intermediate structure formed by the method according to an embodiment of the disclosure.

Reference is made to FIG. 6. FIG. 6 shows a partial top view of an intermediate structure formed by the method according to an embodiment of the disclosure In such embodiment, the features of the patterned hard mask layer 602 (referring to FIG. 7) include a first patterned zone 610 and a second patterned zone 620. The first patterned zone 610 and the second patterned zone 620 have different pattern densities. For example, the first patterned zone 610 has a plurality of first patterns, and adjacent two of the first patterns are spaced from each other by a first gap $G_1$. The second patterned zone 620 has a plurality of second patterns, and adjacent two of the second patterns are spaced from each other by a second gap $G_2$. The second gap $G_2$ is greater than the first gap $G_1$. According to an exemplary embodiment, the first gap $G_1$ is smaller than about 25 nm, and the second gap $G_2$ is about twice greater than the first gap $G_1$ or more.

FIG. 6 further illustrates a reference cross-section A-A' that is used in the following figures.

Figure 7:
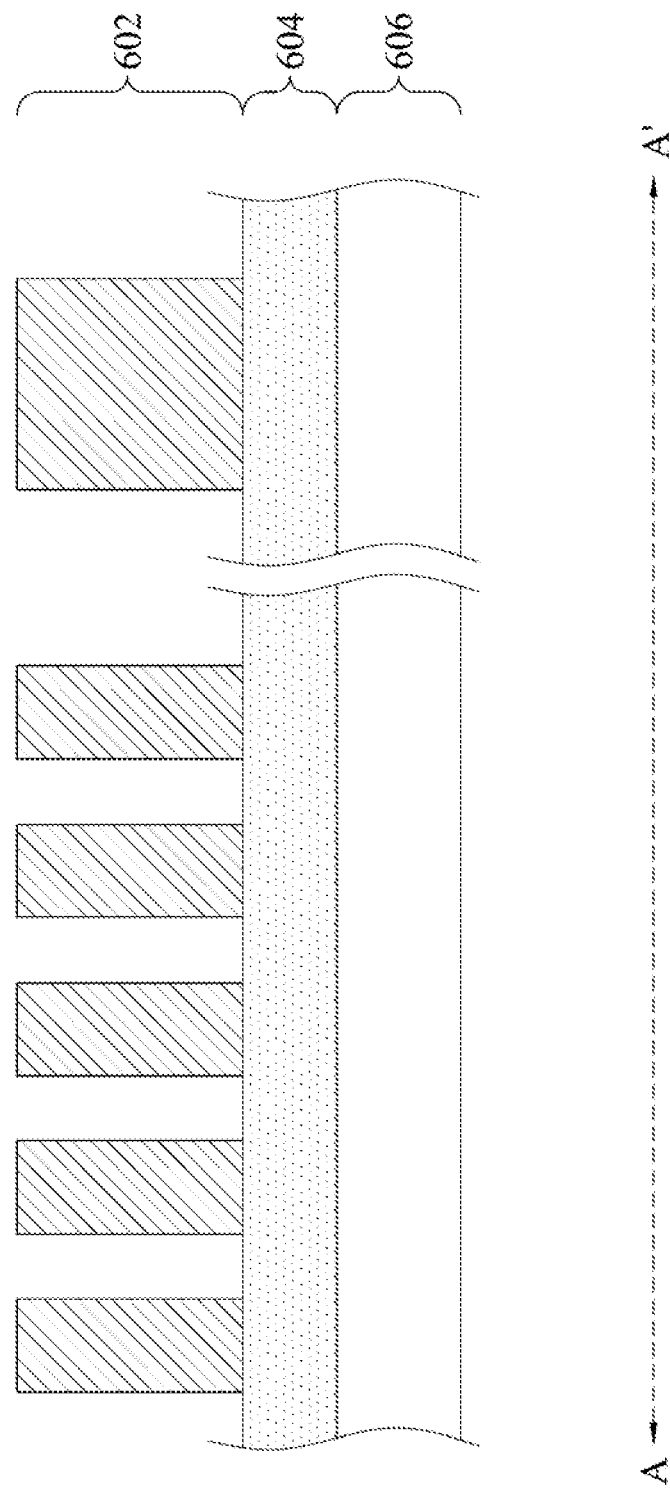
FIG. 7 is a partial cross-sectional view of the intermediate structure in FIG. 6 according to an embodiment of the disclosure.
Figure 8:
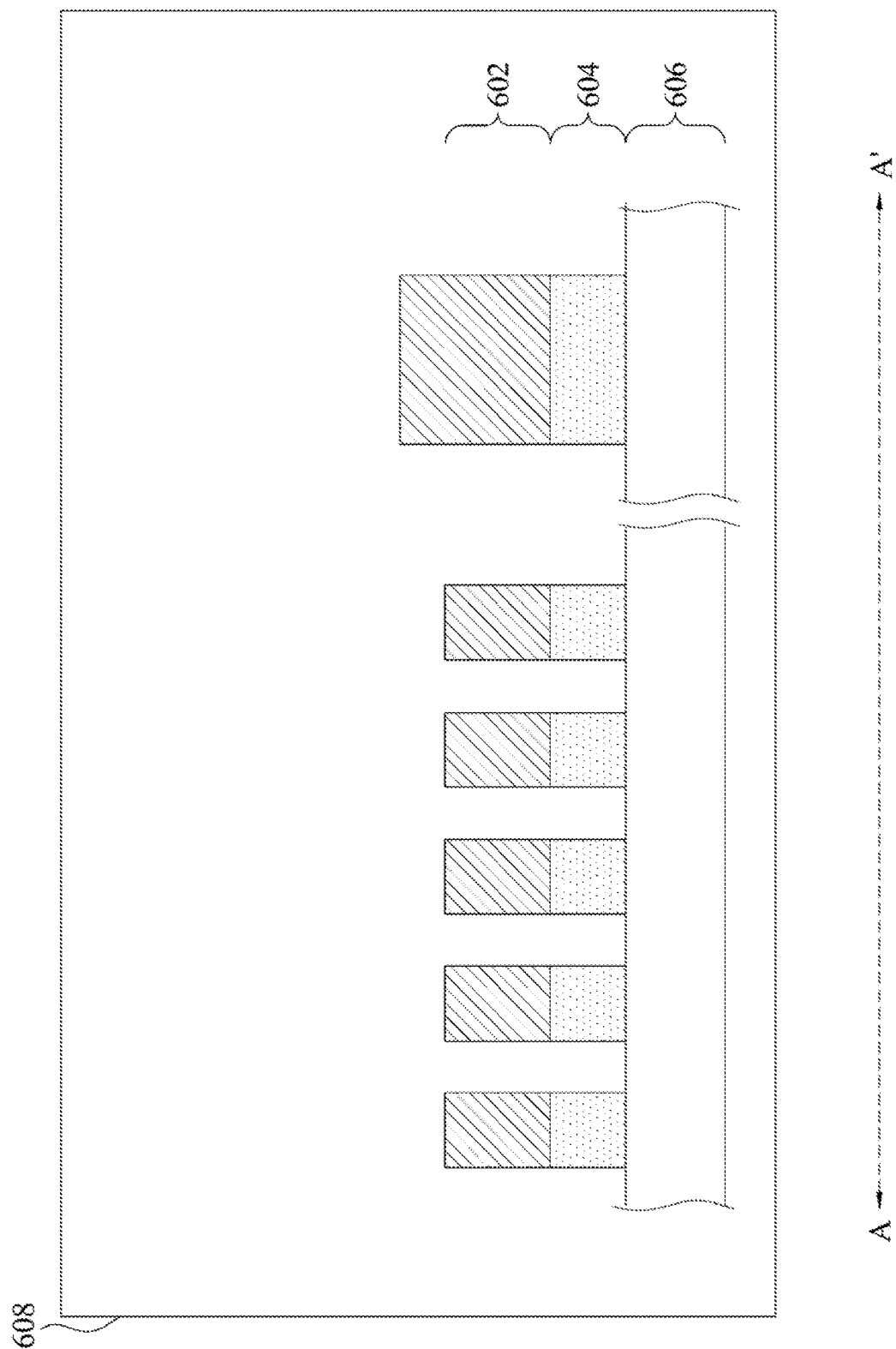
FIG. 8 is a partial cross-sectional view of the intermediate structure in FIG. 6 according to an embodiment of the disclosure.

Reference is made to FIG. 7 and FIG. 8. FIG. 7 and FIG. 8 are partial cross-sectional views of the intermediate structure in FIG. 6 taken along the cross-section A-A' after operation 120 and operation 130, respectively. As aforementioned, the low pressure in the plasma process chamber and the supplied bias voltage increase the mean free path and the kinetic energy of the bombarding ion. In turn, the probability of ion collisions is reduced and the etch rate is increased. Furthermore, the optimally selected volumetric flow ratios of the process gas composition make etch rates across the device surface more uniform. This allows for embodiments with zones of different pattern densities to be etched in one plasma etching process.

Figure 9:
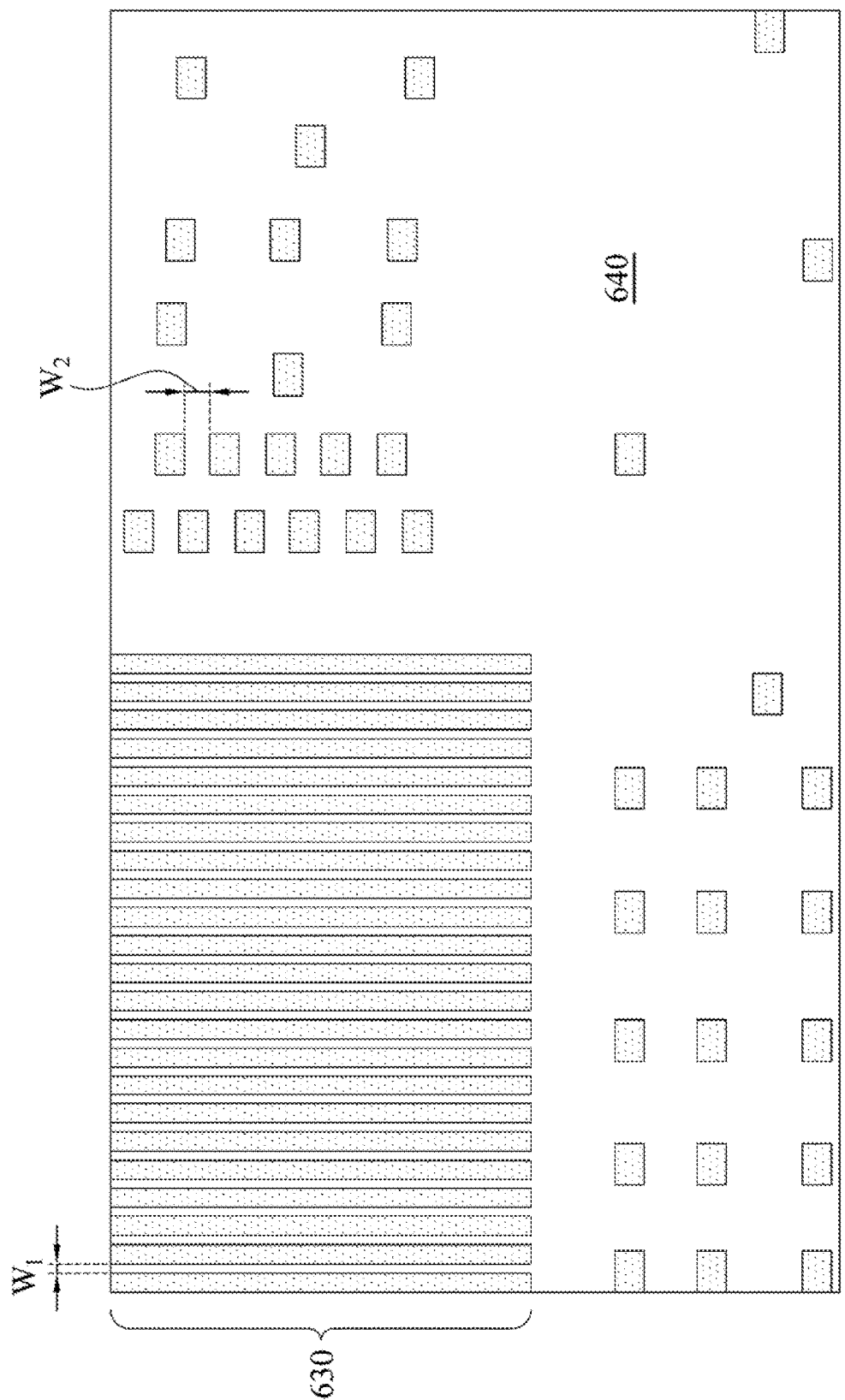
FIG. 9 is a partial top view of the intermediate structure in FIG. 8 according to an embodiment of the disclosure.

Reference is made to FIG. 9. FIG. 9 illustrates a partial top view of the intermediate structure in FIG. 8 according to an embodiment of the present disclosure. Since the patterns of the hard mask layer 602 (not shown in FIG. 9) are transferred to the etched metal layer 604 after the plasma process in the plasma process chamber 608 (referring to FIG. 8), the etched metal layer 604 has a first etched zone 630 and a second etched zone 640. As shown in FIG. 9, in the present embodiment, the first etched zone 630 has a plurality of first trenches corresponding to the first gaps between the first patterns of the first patterned zone 610, and the second etched zone 640 has a plurality of second trenches corresponding to the second gaps between the second patterns of the second patterned zone 620. When the etching is substantially anisotropic, the first trenches have first widths $W_1$ that are about the same dimension as the first gaps $G_1$, and the second trenches have second widths $W_2$ that are about the same dimension as the second gaps $G_2$. Alike the relation between the first gap $G_1$ and the second gap $G_2$, the second width $W_2$ is greater than the first width $W_1$. In an exemplary embodiment, the first width $W_1$ is smaller than about 25 nm, and the second width $W_2$ is about twice greater than the first width $W_1$ or more.

However, one of the disadvantages of low-pressure plasma etching is the low selectivity. The ion bombardment during plasma etching not only causes sputtering of the metal layer 204/604 but also causes sputter removal of the hard mask layer 202/602. Thus, the hard mask layer 202/602 may get consumed faster in low-pressure plasma etching than in wet-chemical etching. Especially in embodiments with zones of different pattern densities to be etched, the hard mask layer gets consumed faster in densely patterned zones than in sparsely patterned zones during plasma etching, as shown in FIG. 8. That is to say, after plasma etching, the thickness of the hard mask layer 602 in the first etched zone 630 is smaller than that of the hard mask layer 602 in the second etched zone 640.

Thereby, the thickness of the hard mask layer 202/602 determines the maximum etch depth that can be achieved in the metal layer 204/604 during plasma etching. As a result, in the present disclosure, the thickness of the hard mask layer 202/602 is deliberately chosen, so that at least a portion of the patterned hard mask layer 202/602 remains on the etched metal layer 204/604 when the portions of the substrate 206/606 are exposed from the etched metal layer 204/604. In an exemplary embodiment, the carbon hard mask layer 202/602 is formed on the tungsten layer 204/604 to a thickness in a range from about 120 nm to about 200 nm, such as 160 nm.

Figure 10:
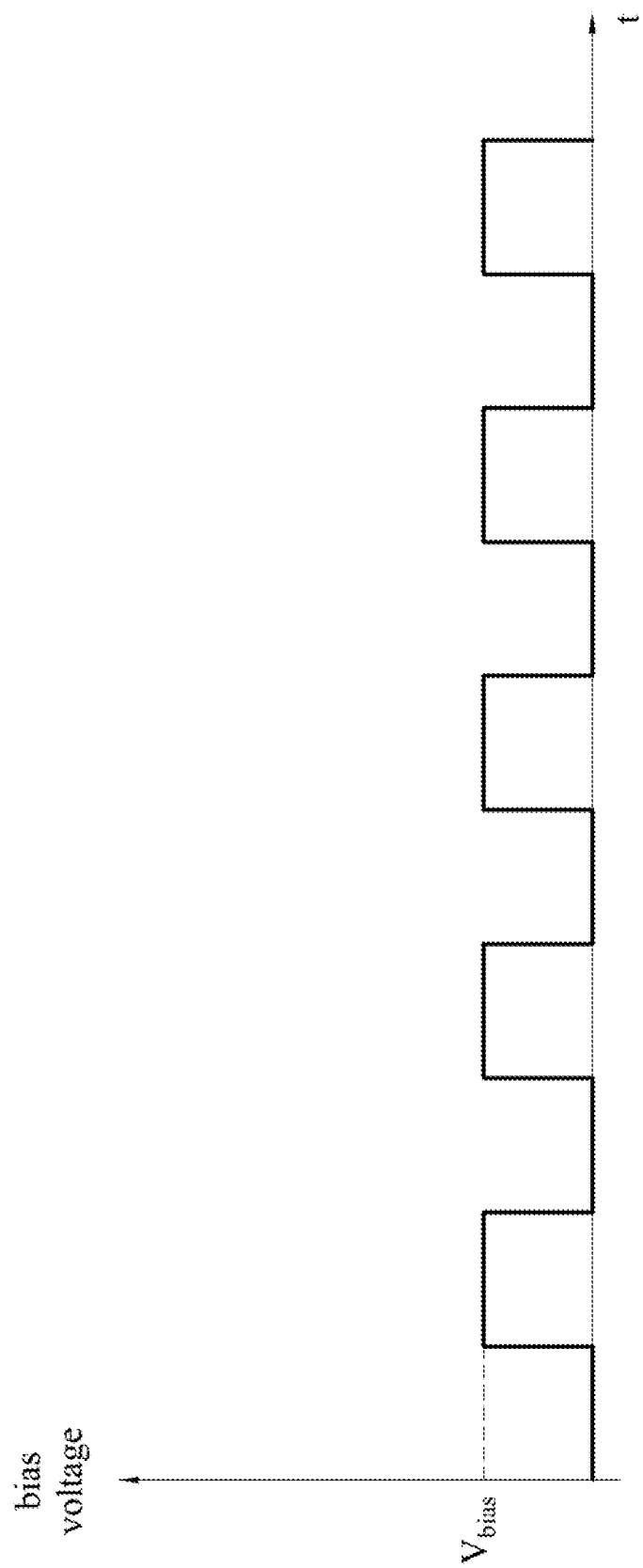
FIG. 10 is a schematic diagram of an example of a pulse waveform used in the method according to an embodiment of the disclosure.

In some embodiments, in order to reduce sputter removal of the hard mask layer 202 due to ion bombardment, the bias voltage $V_{bias}$ is supplied in a pulse waveform. Reference is made to FIG. 10. With a suitable duty cycle, the faceting of the hard mask layer 202 may be reduced, leading to reduced mask consumption. In an exemplary embodiment, the required pulse waveform includes a plurality of duty cycles, wherein each of the duty cycles represents a combination of an ON state and an OFF state of the bias voltage. During the ON state, the bias voltage $V_{bias}$ is applied, and during the OFF state, a zero voltage is applied. That is to say, the pulse waveform includes positive, unipolar pulse trains, as shown in FIG. 10. In such embodiment, the bias voltage $V_{bias}$ may be in a range from about 150 V to about 400 V, more preferably from about 150 V to about 300 V. However, the pulse amplitude, the pulse period, and the duty cycle of the pulse waveform can be chosen for a desired etch profile.

Also, during the OFF state of the pulse waveform, the oxygen radicals covering the sidewalls of the patterned gaps and the trenches being etched may be saturated, which attributes to a reduced and more uniform formation of the passivation layer on the sidewalls. Therefore, the etch profile difference between the two etched zones may become less and the etch profiles may become more vertical.

Figure 11:
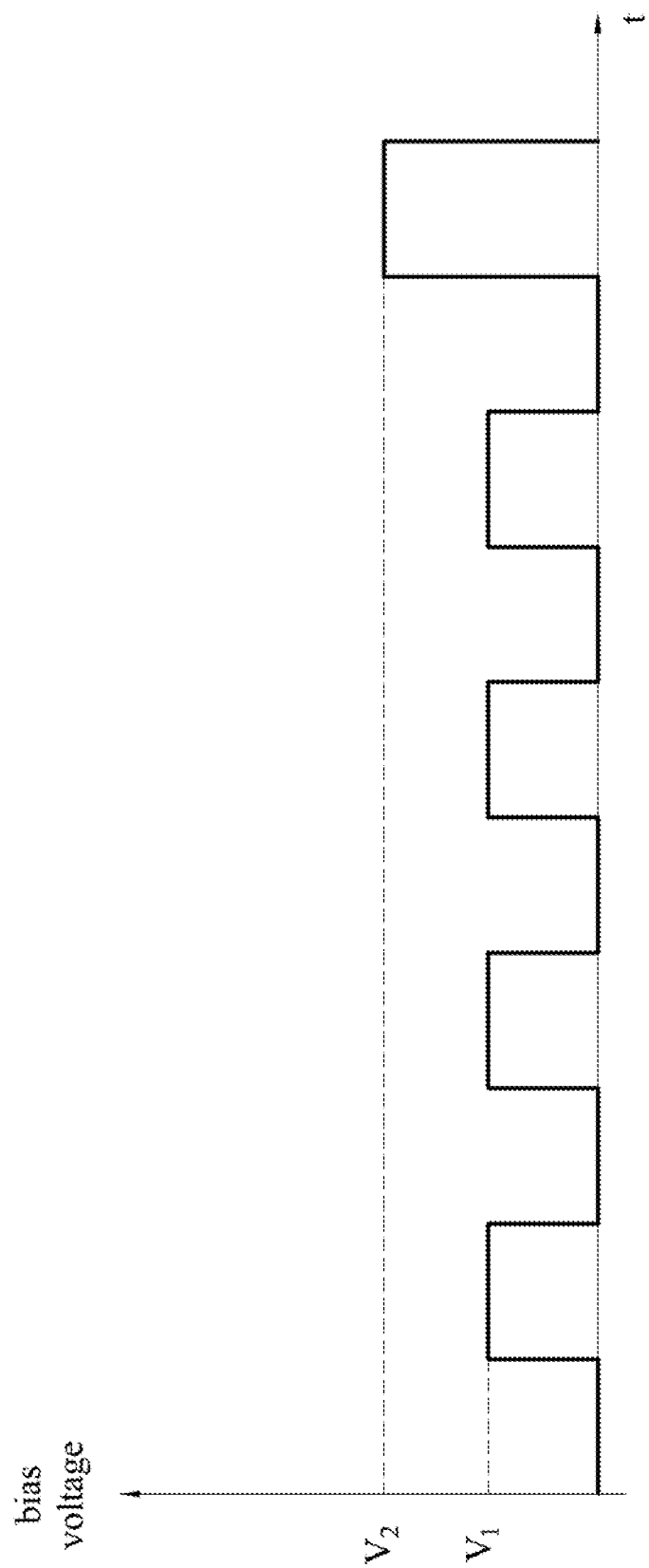
FIG. 11 is a schematic diagram of an example of a pulse waveform used in the method according to another embodiment of the disclosure.

Yet in some embodiments, operation 130 may be performed in two stages. In the first stage, step 132, step 134, and step 136 of operation 130 are conducted at a first bias voltage $V_1$ supplied in a first pulse waveform. The first pulse waveform has a first pulse amplitude that corresponds to the first bias voltage $V_1$. In the second stage, step 132, step 134, and step 136 of operation 130 are conducted at a second bias voltage $V_2$ supplied in a second pulse waveform instead. The second pulse waveform has a second pulse amplitude that corresponds to the second bias voltage $V_2$, and the second amplitude is greater than the first amplitude. In an exemplary embodiment, the first bias voltage $V_1$ is supplied at about 150 V, unipolar pulse trains, and the second bias voltage $V_2$ is supplied at about 300 V, unipolar pulse trains, as shown in FIG. 11. In such embodiment, the first stage accounts for the first 80% of the plasma process, and the second stage accounts for the last 20% of the plasma process, as shown in FIG. 11. However, the proportion of the processing time of the first stage to the processing time of the second stage in the plasma process is not limited to the present embodiment. Also, the plasma process may comprise more than two stages, without departing from the spirit and scope of the present disclosure.

According to the foregoing recitations of the embodiments of the disclosure, it may be seen that in the method of the present disclosure, by applying a plasma process with a certain composition of the process gas mixture or further with pulsing bias voltage, substantially anisotropic etching may be achieved. In addition, with optimally selected volumetric flow ratios of the process gas mixture supplied into the plasma process chamber and an optimally selected thickness of the hard mask layer, the etch profile control may be improved and a more uniform etch rate across the device may be accomplished. This allows for a desired conductive layer having several zones with different pattern densities to be fabricated in one process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a conductive layer of a semiconductor device, comprising:
   forming a hard mask layer on a metal layer overlying a substrate, wherein the metal layer comprises tungsten;
   patterning the hard mask layer until portions of the metal layer are exposed from the patterned hard mask layer; and
   performing a plasma process to the metal layer through the patterned hard mask layer until portions of the substrate are exposed from the etched metal layer, wherein a process gas mixture used in the plasma process comprises a fluorine based gas, a chlorine based gas, and oxygen, wherein the performing the plasma process comprises a first stage and a second stage, the first stage is conducted at a first bias voltage supplied in a first pulse waveform having a first amplitude, the second stage is conducted at a second bias voltage supplied in a second pulse waveform having a second amplitude, the second amplitude is greater than the first amplitude, and the first bias voltage and the second bias voltage are in a range from about 150 V to about 400 V.

2. The method of claim 1, wherein the patterning the hard mask layer forms a first patterned zone and a second patterned zone in the patterned hard mask layer, the first patterned zone comprises a plurality of first patterns, the second patterned zone comprises a plurality of second patterns, a first gap between adjacent two of the first patterns is smaller than about 25 nm, and a second gap between adjacent two of the second patterns is greater than the first gap.

3. The method of claim 1, wherein the hard mask layer comprises carbon.

4. The method of claim 1, wherein at least a portion of the patterned hard mask layer remains on the etched metal layer when the portions of the substrate are exposed from the etched metal layer.

5. The method of claim 1, wherein the performing the plasma process comprises:
placing the substrate with the patterned hard mask layer thereon into a plasma process chamber;
supplying the process gas mixture into the plasma process chamber; and
generating a plasma from the process gas mixture to etch the metal layer through the patterned hard mask layer.

6. The method of claim 5, wherein the fluorine based gas comprises nitrogen trifluoride and the chlorine based gas comprises chlorine.

7. The method of claim 6, wherein a volumetric flow ratio between chlorine and nitrogen trifluoride of the process gas mixture supplied into the plasma process chamber is in a range from about 1.0 to about 2.0.

8. The method of claim 6, wherein a volumetric flow ratio between oxygen and nitrogen trifluoride of the process gas mixture supplied into the plasma process chamber is in a range from about 1.0 to about 2.0.

9. A method of forming a conductive layer of a semiconductor device, comprising:
forming a hard mask layer on a metal layer overlying a substrate, wherein the metal layer comprises tungsten;
patterning the hard mask layer until portions of the metal layer are exposed from the patterned hard mask layer, such that the patterned hard mask layer has a first patterned zone and a second patterned zone, wherein the first patterned zone comprises a plurality of first patterns, the second patterned zone comprises a plurality of second patterns, a first gap between adjacent two of the first patterns is smaller than about 25 nm, and a second gap between adjacent two of the second patterns is greater than the first gap; and
performing a plasma process to the metal layer through the patterned hard mask layer until portions of the substrate are exposed from the etched metal layer, wherein the performing the plasma process comprises a first stage and a second stage, the first stage is conducted at a first bias voltage supplied in a first pulse waveform having a first amplitude, the second stage is conducted at a second bias voltage supplied in a second pulse waveform having a second amplitude, the second amplitude is greater than the first amplitude, and the first bias voltage and the second bias voltage are in a range from about 150 V to about 400 V.

10. The method of claim 9, wherein the patterned hard mask layer comprises carbon.

11. The method of claim 9, wherein at least a portion of the patterned hard mask layer remains on the etched metal layer when the portions of the substrate are exposed from the etched metal layer.

12. The method of claim 9, wherein the performing the plasma process comprises:
placing the substrate with the patterned hard mask layer thereon into a plasma process chamber;
supplying a process gas mixture into the plasma process chamber; and
generating a plasma from the process gas mixture to etch the metal layer through the patterned hard mask layer.

13. The method of claim 12, wherein:
the process gas mixture comprises a fluorine based gas, a chlorine based gas, and oxygen;
the fluorine based gas comprises nitrogen trifluoride;
the chlorine based gas comprises chlorine; and
the metal layer is etched such that the metal layer forms a first etched zone and a second etched zone upon completion of the plasma process, the first etched zone comprises a plurality of first trenches, the second etched zone comprises a plurality of second trenches, a first width of one of the first trenches is smaller than about 25 nm, and a second width of one of the second trenches is greater than the first width.

14. The method of claim 13, wherein a volumetric flow ratio between chlorine and nitrogen trifluoride of the process gas mixture supplied into the plasma process chamber is in a range from about 1.0 to about 2.0.

15. The method of claim 13, wherein a volumetric flow ratio between oxygen and nitrogen trifluoride of the process gas mixture supplied into the plasma process chamber is in a range from about 1.0 to about 2.0.

\* \* \* \* \*